(12) United States Patent
Chew et al.

(10) Patent No.: US 6,225,169 B1
(45) Date of Patent: May 1, 2001

(54) HIGH DENSITY PLASMA NITRIDATION AS DIFFUSION BARRIER AND INTERFACE DEFECT DENSITIES REDUCTION FOR GATE DIELECTRIC

(75) Inventors: Kok Heng Chew, Fremont; Patrick van Cleemput, Sunnyvale, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/512,193

(22) Filed: Feb. 24, 2000

(51) Int. Cl.[7] .................................................. H01L 21/336
(52) U.S. Cl. ........................................... 438/287; 438/591
(58) Field of Search ...................................... 438/287, 591

(56) References Cited

U.S. PATENT DOCUMENTS 6,087,238 * 7/2000 Gardner et al. ...................... 438/304
6,140,187 * 10/2000 Debusk et al. ....................... 438/287

OTHER PUBLICATIONS

Lee, D. R. et al. Reliability of Nitrided Si–$SiO_2$ Interface Formed by a New, Low–temperature, Remote–Plasma Process. *Journal of Vacuum Science Technology*, vol. 13, No. 4 (Jul./Aug. 1995), pp.1788–1793.

Ma, Yi et al. Si–$SiO_2$ Interfaces Formed by Remote Plasma–Enhanced Chemical Vapor Deposition of $SiO_2$ on Plasma–processed Si Substrates. *Journal of Vacuum Science Technology*, vol. 10, No. 4 (Jul./Aug. 19925), pp.781–787.

* cited by examiner

Primary Examiner—Long Pham
(74) Attorney, Agent, or Firm—DeLio & Peterson, LLC; Peter W. Peterson; Roland Tso

(57) ABSTRACT

A method of constructing a gate dielectric on a semiconductor surface includes cleaning a silicon surface then growing a silicon nitride barrier layer on the silicon surface using a high density plasma (HDP) of nitrogen. A gate dielectric layer is then deposited on the silicon nitride layer and a second silicon nitride layer is then grown on the dielectric layer, also using an HDP nitrogen plasma, followed by deposition of the conductive gate layer. The HDP nitrogen plasma is heated using an inductively coupled radio frequency generator. The invention also includes a gated device including a gate dielectric constructed on a semiconductor surface by the method of the invention.

20 Claims, 1 Drawing Sheet

HIGH DENSITY PLASMA NITRIDATION AS DIFFUSION BARRIER AND INTERFACE DEFECT DENSITIES REDUCTION FOR GATE DIELECTRIC

BACKGROUND OF THE INVENTION

1. Field of the Invention

The present invention relates to gate dielectric layers formed during the construction of gated semiconductor devices, such as field effect transistors (FETs). More specifically, the present invention relates to a method of producing a silicon nitride barrier between a silicon surface and a gate dielectric layer.

2. Description of Related Art

In current semiconductor technologies, silicon oxide ($SiO_2$) is often used for its insulating properties as a gate oxide. As device dimensions shrink into the deep submicron range in ultra scale integrated (ULSI) circuit applications, the gate dielectric thickness must decrease proportionally in FETs to approximately 3 to 3.5 nanometers. In this regime of ultra thin dielectrics, interfacial defects, defect precursors, and the diffusion of dopants through gate dielectrics play dominant roles in device performance and reliability.

There is a large body of experimental data for thin oxide dielectrics which demonstrates that: (i) hydrogen atom transport from polycrystalline silicon gate electrodes to the silicon-silicon oxide (Si—$SiO_2$) interface under stressbias conditions generates interfacial traps and positively charged defects and (ii) nitrogen atom incorporation at Si—$SiO_2$ interfaces improves device reliability, while interfacial nitrogen-hydrogen bonding leads to high defect densities.

Polysilicon used as the gate electrode in a metal oxide semiconductor field effect transistor (MOSFET) device is normally doped with phosphorous to a concentration of greater than $10^{21}$ $cm^{-3}$ to minimize the series resistance. Beneath the polysilicon gate is the gate oxide, and directly beneath the gate oxide is the channel that is typically more lightly doped by a factor of $10^4$. Since the gate oxide thickness in deep submicron devices is very thin, any small leakage of the gate electrode dopant into the channel shifts the device threshold and makes the device inoperative.

To prevent the leakage of the gate electrode dopant into the channel, it is known to deposit a nitride barrier layer between the gate oxide and the channel. Typically, a rapid thermal nitridation (RTN) process is used to deposit this nitride layer. The RTN process is relatively costly and slow because the wafers must be moved into different chambers during cleaning and depositing steps required for the RTN process. The RTN process also produces less uniform nitride layer than is desirable for ULSI devices.

Bearing in mind the problems and deficiencies of the prior art, it is therefore an object of the present invention to provide a less expensive and faster nitridation process than the RTN process for the construction of gate dielectrics.

It is another object of the present invention to provide a more uniform nitride layer than is produced by the RTN process.

Still other objects and advantages of the invention will in part be obvious and will in part be apparent from the specification.

SUMMARY OF THE INVENTION

This invention uses a high density plasma (HDP) method to produce silicon nitride layers. A major benefit of using HDP nitridation is that native oxide cleaning, carbon contamination of silicon surface cleaning, and silicon nitridation can all be performed as a single integrated process in a single chamber.

The silicon nitride layer is grown using an inductively coupled HDP source in multiple steps. The first step is to clean the native oxide formed on the silicon or polysilicon surface using an HDP plasma, preferably an HDP hydrogen plasma. This contamination cleaning can also be performed using an HDP oxygen plasma for fifteen seconds. To aid in cleaning, the silicon surface may also be bombarded with a pure HDP argon plasma.

The next step is to grow the silicon nitride layer on the clean silicon (or polysilicon) surface using the HDP nitridation method. This technique produces a very thin layer of a silicon nitride film (approximately 20 to 30 Å) on the silicon or polysilicon surface by exposing the wafer to pure nitrogen plasma. The plasma is preferably created using inductive coupling which is powered using a low radio frequency generator. The result is a uniform (<2%, 1σ) nitride layer on the silicon or polysilicon surface.

After the above process is completed, the gate oxide is deposited. Another HDP nitridation process is then completed. in this step of the process, a thin layer of nitrided oxide is grown on the gate oxide film. This nitrided oxide film layer is also grown using the HDP process. This film serves to overcome the charge defeats described above as well as the diffusion barrier for the dopant.

More specifically, the present invention comprises a method of constructing a gate dielectric on a semiconductor surface which includes the steps of contamination cleaning the semiconductor surface in a chamber using a high density plasma of a first gaseous agent, growing a first silicon nitride layer on the semiconductor surface using a high density plasma of nitrogen, growing a gate dielectric layer on the silicon nitride layer, growing a second silicon nitride layer on the dielectric layer using a high density plasma of nitrogen, and depositing a conductive layer over the second silicon nitride layer to form a conductive gate.

In the preferred method of the invention the first gaseous agent in the step of contamination cleaning is hydrogen. In another embodiment of the invention the first gaseous agent in the step of contamination cleaning is oxygen. The step of contamination cleaning the semiconductor surface may alternatively comprise using a combination of a high density hydrogen plasma with a high density argon plasma.

In another aspect of the invention the high density plasma of nitrogen used in the step of growing a first silicon nitride layer on the semiconductor surface is formed by heating nitrogen gas with an inductively coupled radio frequency generator.

The step of growing a gate dielectric layer on the silicon nitride layer preferably includes growing a layer of silicon oxide on the silicon nitride layer to form the gate dielectric layer. In the most highly preferred method of the invention, the steps of contamination cleaning and growing a first silicon nitride layer are both completed in the same chamber without removing the semiconductor chip from the chamber.

The deposition temperature used during the step of growing a first silicon nitride layer on the semiconductor surface is most preferably between about 300 and 450° C. The invention is also directed to gated devices that have a gate dielectric constructed on a semiconductor surface by the method of the invention above.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
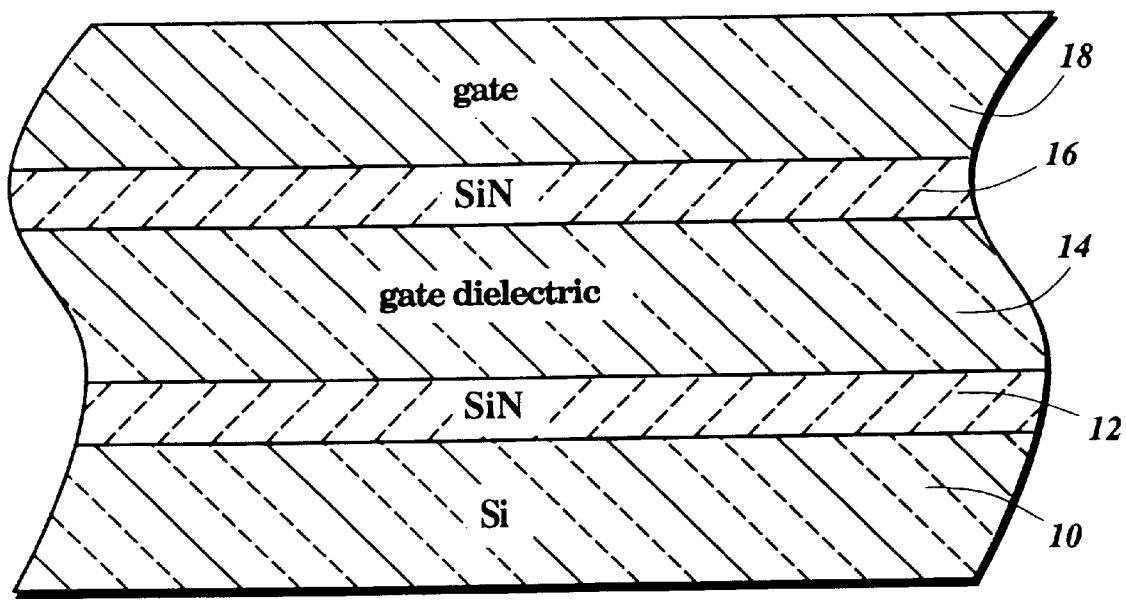
FIG. 1 is a cross sectional view of a gatedevice, such as a field effect transistor, including a gate dielectric construed on a semiconductor surface according to the method of the present invention.

In describing the preferred embodiment of the present invention, reference will be made herein to FIG. 1 of the drawings in which like numerals refer to like features of the invention. Features of the invention are not necessarily shown to scale in the drawings.

FIG. 1 provides a cross sectional view of a gate dielectric on a semiconductor surface prepared according to the method of this invention. A silicon surface 10 has a silicon nitride layer 12 deposited thereon using a high density plasma (HDP) reactor. A gate dielectric layer 14 is then deposited conventionally, and another nitride layer 16 is then deposited in the HDP reactor. Finally, the conductive gate 18 is deposited.

An example of a method of constructing the gate dielectric on a semiconductor surface according to this invention starts with a contamination cleaning step. A preferred method of contamination cleaning is to use a hydrogen $H_2$ heating step. A polysilicon patterned silicon wafer 10 may be effectively cleaned in an HDP plasma having the following process parameters:

| $H_2$ Heating Step for Contamination Cleaning: | |
| --- | --- |
| Low Frequency power | 2000–4800 Watt |
| $H_2$ gas | 200–500 sccm |
| Ar gas | 0–200 sccm |
| Stationary deposition time | 3–60 seconds |
| Deposition temperature | 300–450° C. |

The plasma is heated with an inductively coupled radio frequency generator operating at the power level given above.

The use of Argon gas is optional, and the cleaning step with hydrogen may be preceded by, or replaced by a contamination cleaning step in which oxygen is used. Other types of cleaning methods may be used, however, a contamination cleaning step using a high density plasma is preferred.

After the contamination cleaning step is completed the exposed silicon surface 10 is clean and ready for the main nitridation step to take place. The nitridation step may be effectively implemented with the following process parameters:

| Nitridation Step: | |
| --- | --- |
| Low Frequency power | 2000–4800 Watt |
| $N_2$ gas | 200–500 sccm |
| Stationary deposition time | 3–60 seconds |
| Deposition temperature | 300–450° C. |

The nitridation step results in a thin, uniform layer that is less than 100 Angstroms thick, preferably between about 10 and 40 Angstroms thick, and most preferably about 20 to 30 Angstroms thick. When the nitridation, step is completed, and the silicon nitride layer 12 is formed, the wafer is removed from the deposition chamber and is ready for the deposition of the gate dielectric layer 14. The gate dielectric layer 14 is preferably silicon oxide (SiO), however, tantalum oxide ($Ta_2O_5$) may also be used. Preferably, the contamination cleaning and nitridation steps are performed in the same HDP reactor chamber. The nitride layer 12 forms an effective barrier between the silicon surface 10 and the overlying dielectric layer 14.

Gate dielectric deposition is performed in a conventional manner to apply an oxide layer that is preferably 20 to 30 Å thick. After gate dielectric deposition is completed, the above two steps (cleaning and nitridation) are repeated to form a second silicon nitride layer 16 that acts as a barrier between the dielectric layer 14 and the gate 18. The second layer of nitride is formed on the silicon oxide layer 14, instead of on the silicon surface 10, but otherwise the process steps, including cleaning and deposition, are identical to those described above.

After the second silicon nitride layer 16 is formed, the gate layer 18 is deposited. Gate deposition is conventional. The gate may be any type of conductive layer conventionally used to form a gate, such as polysilicon, tungsten, platinum and combinations thereof.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of constructing a gate dielectric on a semiconductor surface comprising the steps of:

contamination cleaning the semiconductor surface in a chamber using a high density plasma of a first gaseous agent;

growing a first silicon nitride layer on the semiconductor surface using a high density plasma of nitrogen;

growing a gate dielectric layer on the silicon nitride layer;

growing a second silicon nitride layer on the dielectric layer using a high density plasma of nitrogen; and depositing a conductive layer over the second silicon nitride layer to form a conductive gate.

2. The method of constructing a gate dielectric on a semiconductor surface according to claim 1 wherein the first gaseous agent in the step of contamination cleaning is hydrogen.

3. The method of constructing a gate dielectric on a semiconductor surface according to claim 1 wherein the first gaseous agent in the step of contamination cleaning is oxygen.

4. The method of constructing a gate dielectric on a semiconductor surface according to claim 1 wherein the step of contamination cleaning the semiconductor surface comprises using a high density hydrogen plasma with a high density argon plasma.

5. The method of constructing a gate dielectric on a semiconductor surface according to claim 1 wherein the high density plasma of nitrogen used in the step of growing a first silicon nitride layer on the semiconductor surface is formed by heating nitrogen gas with an inductively coupled radio frequency generator.

6. The method of constructing a gate dielectric on a semiconductor surface according to claim 1 wherein the step of growing a gate dielectric layer on the silicon nitride layer comprises growing a layer of silicon oxide on the silicon nitride layer to form the gate dielectric layer.

7. The method of constructing a gate dielectric on a semiconductor surface according to claim 1 wherein the steps of contamination cleaning and growing a first silicon nitride layer are both completed in the chamber without removing the semiconductor surface from the chamber.

8. The method of constructing a gate dielectric on a semiconductor surface according to claim 7 wherein the high density plasmas used during the steps of the method are formed by heating with an inductively coupled radio frequency generator.

9. The method of constructing a gate dielectric on a semiconductor surface according to claim 1 wherein the step of growing a first silicon nitride layer on the semiconductor surface comprises growing a first silicon nitride layer that is less than about 100 Angstroms thick.

10. The method of constructing a gate dielectric on a semiconductor surface according to claim 9 wherein the step of growing a first silicon nitride layer on the semiconductor surface comprises growing a first silicon nitride layer that is between about 10 and 40 Angstroms thick.

11. The method of constructing a gate dielectric on a semiconductor surface according to claim 1 wherein the high density plasma used during the step of growing a first silicon nitride layer on the semiconductor surface is formed by heating with an inductively coupled radio frequency generator operating at between about 2000 and 4800 watts.

12. The method of constructing a gate dielectric on a semiconductor surface according to claim 1 wherein the semiconductor surface is silicon and the silicon surface is exposed to the nitrogen plasma during the step of growing a first silicon nitride layer on the semiconductor surface for a period of time ranging from about 3 to 60 seconds.

13. The method of constructing a gate dielectric on a semiconductor surface according to claim 1 wherein the semiconductor surface is silicon and the silicon surface is held at a temperature of between about 300 and 450° C. during the step of growing a first silicon nitride layer on the semiconductor surface.

14. The method of constructing a gate dielectric on a semiconductor surface according to claim 1 wherein the high density plasma used during the step of contamination cleaning is formed by heating with an inductively coupled radio frequency generator operating at between about 2000 and 4800 watts.

15. The method of constructing a gate dielectric on a semiconductor surface according to claim 1 wherein the high density plasma used during the step of contamination cleaning is a hydrogen plasma and the silicon surface is exposed to the hydrogen plasma for a period of time ranging from about 3 to 60 seconds.

16. The method of constructing a gate dielectric on a semiconductor surface according to claim 1 wherein the high density plasma used during the step of contamination cleaning is a hydrogen plasma and the semiconductor surface is held at a temperature of between about 300 and 450° C.

17. A gated device including a gate dielectric constructed on a semiconductor surface by a method comprising the steps of:

contamination cleaning the semiconductor surface in a chamber using a high density plasma of a first gaseous agent;

growing a first silicon nitride layer on the semiconductor surface using a high density plasma of nitrogen;

growing a gate dielectric layer on the silicon nitride layer;

growing a second silicon nitride layer on the dielectric layer using a high density plasma of nitrogen; and depositing a conductive layer over the second silicon nitride layer to form a conductive gate.

18. The gated device of claim 17 wherein the first gaseous agent in the step of contamination cleaning is hydrogen.

19. The gated device of claim 18 wherein the step of growing a gate dielectric layer on the silicon nitride layer comprises growing a layer of silicon oxide on the silicon nitride layer to form the gate dielectric layer.

20. The gated device of claim 19 wherein the high density plasmas used during the steps of the method are formed by heating with an inductively coupled radio frequency generator.

* * * * *